(12) United States Patent
Chen et al.

(10) Patent No.: US 6,340,547 B1
(45) Date of Patent: Jan. 22, 2002

(54) METHOD OF FORMING CIRCUIT PATTERNS ON SEMICONDUCTOR WAFERS USING TWO OPTICAL STEPPERS HAVING NONALIGNED IMAGING SYSTEMS

(75) Inventors: Ming-Fa Chen; Chih-Chien Hung; Chia-Hsiang Chen, all of Hsin-Chu; Fu-Tien Wong, Taow-Yuan, all of (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 0 days.

(21) Appl. No.: 09/481,032

(22) Filed: Jan. 11, 2000

(51) Int. Cl.[7] .................................................. G03F 9/00
(52) U.S. Cl. ........................................... 430/22; 430/30
(58) Field of Search ....................................... 430/22, 30

(56) References Cited

U.S. PATENT DOCUMENTS 6,190,807 B1 * 2/2001 Wang et al. .................. 430/22

* cited by examiner

*Primary Examiner*—Christopher G. Young
(74) *Attorney, Agent, or Firm*—Tung & Associates

(57) ABSTRACT

A method of forming circuit patterns on a semiconductor wafer using two different image steppers having nonaligned optical image systems achieves optical alignment of multiple overlays with high accuracy. A first alignment mark is imaged by the first stepper onto a material layer deposited on the wafer, and a second alignment mark is imaged onto a subsequently deposited material layer using the second stepper. Alignment of the two marks, and thus of successively imaged, overlying circuit patterns, is achieved by translating the optical coordinates of the second alignment system into the those of the first alignment system, and then making corresponding two dimensional adjustment of the wafer position relative to the second stepper.

7 Claims, 3 Drawing Sheets

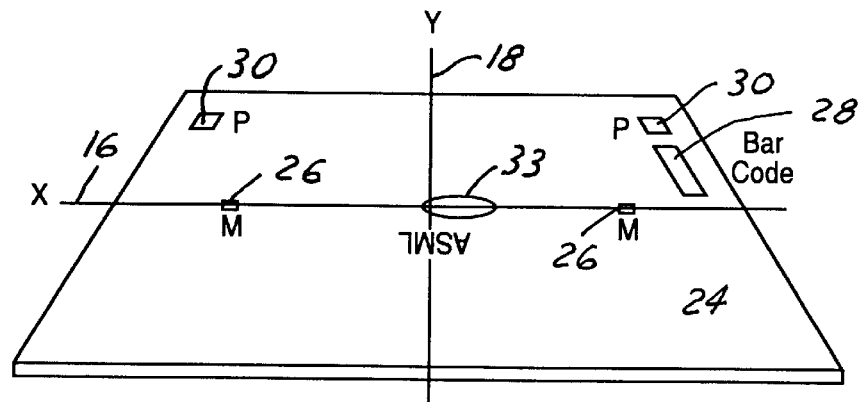
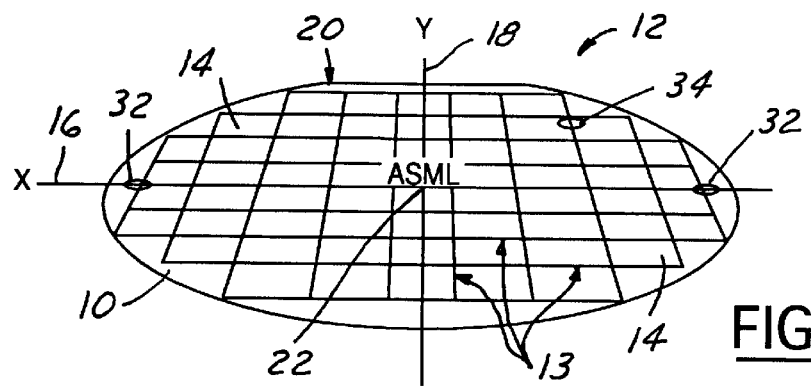
FIG. 1
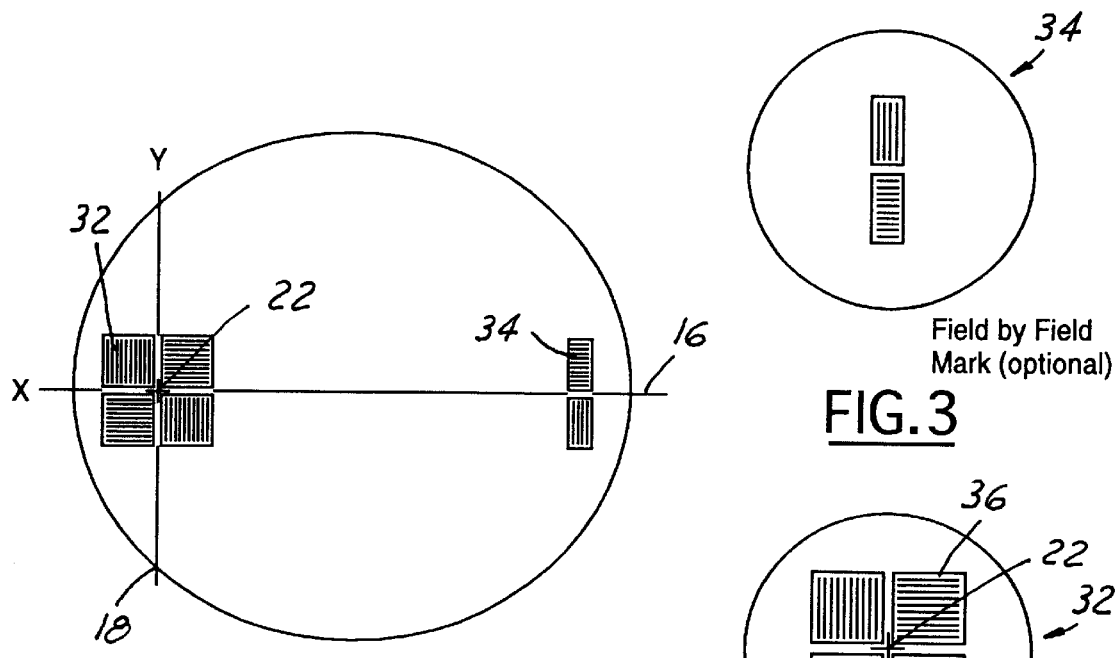
FIG. 2
Field by Field Mark (optional)
FIG. 3
Global Mark
FIG. 4

METHOD OF FORMING CIRCUIT PATTERNS ON SEMICONDUCTOR WAFERS USING TWO OPTICAL STEPPERS HAVING NONALIGNED IMAGING SYSTEMS

TECHNICAL FIELD

The present invention broadly relates to semiconductor manufacturing processes involving photolithography techniques, and deals more particularly with a method for imaging circuit patterns on successively deposited layers of materials using two different image steppers having non-aligned optical systems.

BACKGROUND OF THE INVENTION

The art of photolithography commonly used in semiconductor manufacturing processes is well developed. With the trend towards increasing circuit density, there is a need for higher resolution and greater accuracy of alignment of the circuit patterns that are successively formed in overlying relationship on multiple layers deposited on a wafer. Circuit patterns are commonly imaged onto the wafer by so-called step-and-repeat machines or "steppers" which comprise a projection exposure system that transfers a reticle pattern containing the desired circuit onto a wafer substrate at a predetermined magnification through an optical projection system. These steppers include an optical alignment system, usually unique to each stepper manufacturer, which employs a series of alignment marks that are etched onto the wafer substrate such that successively imaged patterns on multiple layers built up on the substrate are optically aligned so as to be precisely registered with each other. Alignment accuracy is considered to be how accurately the patterns of one level match their corresponding patterns on other levels. For contact etching, photo resist patterning or wafer deposition, there are several alignment marks per wafer. If one of the layers is misaligned, then a serious defect will arise in the competed semiconductor device. The accuracy of the alignment process is also a major factor that determines the yield of completed devices. To achieve the necessary alignment precision, alignment marks are used that are incorporated into the chip and/or put in or on the edge of the wafer. Alignment marks are typically formed by etching a depth into the wafer. The etching causes a pattern with a step height in the wafer that acts as the alignment mark. One of the typical alignment marks is formed at the scribe lines of the wafer. As is well known in the art, a wafer provided with alignment marks formed therein is coated with a transparent photosensitive material, such as photo resist. The wafer is then loaded into the stepper. The stepper uses a laser beam with a fixed wavelength to sense the position of the alignment marks on the wafer by using the alignment marks as a reference point. The alignment marks are employed to adjust position of the wafer to precisely align it with the previous layer on the wafer. The interference from the alignment marks is reflected back to detecting devices in the stepper. The interference is also used as a signal to measure the exact position of the alignment marks.

As previously mentioned, the alignment mark pattern is typically formed in the alignment area or scribe lines of the wafer. Subsequent layers used to form the integrated circuit are formed over the wafer, thereby coving the original alignment mark pattern. The alignment mark is therefore replicated in the subsequently formed layers. As more layers are added to the integrated circuit, the alignment mark pattern is propagated upward with subsequent layers. In some fabrication processes, a polishing process is needed to remove a portion of the inter-level dielectric layer for achieving better topography.

One of the problems associated with building up the alignment mark pattern is that it is incompatible with certain manufacturing processes, such as a planarization process, where the surface of the wafer is planarized for a subsequently formed layer, by laying down a metal layer that provides a flat surface. With a metal layer deposited over the alignment mark pattern of the underlying layer, it may be appreciated that the replicated alignment mark in the inter level dielectric layer is removed during the polishing process. If a metal layer of polysilicon layer is then formed over the dielectric layer, the replicated alignment mark in these layers becomes invisible because the metal layer is opaque to the laser beam. Accordingly, it is impossible to then align the metal pattern to the contact pattern.

One solution to the above described problem of aligning alignment marks where the upper alignment mark is made invisible due to an overlying layer of material, involves the use of so-called "clear-out windows". Clear-out windows are formed by plasma etching the top metal layer, until the underlying alignment mark on a lower material layer has been revealed. This lower alignment mark is then used by the stepper to align subsequently imaged patterns onto the top (metal) layer for further processing. However, the process of forming clear-out windows is relatively complicated and requires a substantial amount of time for fabrication.

As previously mentioned, the exact geometries and arrangement of alignment components in steppers are normally unique to each stepper manufacturer. This means that the alignment systems used by various stepper manufacturers are different, and thus are incompatible with each other. In other words, steppers from multiple manufacturers normally cannot be employed to form layers of circuit patterns on the same wafer for the reason that the layered circuit patterns would not be aligned since the alignment marks replicated by different steppers would not register with each other. In many operations this is not a problem because only a single stepper is employed to image the patterns on all layers of a given wafer. However there are some circumstances in which it would be desirable, if possible, to employ at least two different steppers to perform imaging operations on the same wafer. For example, a semiconductor foundry might be requested by a customer to form several preliminary material layers on a wafer before the wafer is shipped to the customer who later employs a second, differing stepper to image patterns on subsequently deposited layers of the wafers. In the event that the semiconductor foundry's stepper possess an alignment system different than that used by the customer, the ICs cannot be properly completed by the customer since the patterned layers will not be aligned with each other.

It would therefore be highly desirable to provide a method for forming circuit patterns on a semiconductor wafer using at least two imaging steppers respectively having different, non-aligned, optical alignment systems. The present invention is directed toward satisfying this need.

SUMMARY OF THE INVENTION

According to one aspect of the invention, a method is provided for forming circuit patters on a semiconductor wafer using first and second optical image steppers respectively having first and second differing optical alignment systems. The method includes the steps of: imaging a first alignment mark on a wafer using the first stepper; determining the two dimensional optical coordinate differences between the first and second alignment systems; translating the optical coordinates of the second alignment system based on the coordinate differences previously determined, whereby to correlate the second alignment system with the first alignment system and, imaging a second alignment mark on the wafer using the second alignment system and the translated optical coordinates, such that the first and second alignment marks are aligned in a common optical alignment system. Preferably, first and second blocks of pattern-free space are reserved on the wafer and a first alignment mark is performed by imaging the mark in the first block of space, and the second alignment mark is imaged in the second block of space. The method also desirably includes producing an overlay reference pattern exhibiting a set of desired alignment properties related to the alignment of the first and second alignment systems, and comparing the circuit patters on the wafer to the reference pattern in order to verify that the desired alignment between the first and second steppers has been achieved. Preferably, the first alignment mark is formed on a passivation layer deposited on the wafer, and the second alignment mark is deposited on a metal layer formed over the passivation layer.

According to another aspect of the invention, a method is provided for imaging alignment marks onto a semiconductor wafer using first and second optical imaging steppers respectively having first and second, spatially non-aligned optical imaging systems. The method includes the steps of: imaging a first alignment mark on the wafer using the first stepper; producing a set of data representing the two dimensional optical offset between the first and second optical imaging systems; and, imaging a second alignment mark on the wafer using the second stepper and the data, such that the second alignment mark is aligned with the first alignment mark in the first optical imaging system.

According to a still further aspect of the invention, a method is provided for forming circuit patterns on a semiconductor wafer using first and second optical imaging steppers respectively having first and second differing optical alignment systems. Each of the alignment systems includes at least one alignment mark for aligning images on a wafer. The method comprises the steps of: reserving first and second, spaced-apart, pattern-free blocks of space on the wafer within which alignment marks may be imaged; imaging a first alignment mark in the first block space using the first stepper; producing a set of data representing the two dimensional spatial offset between the first and second optical alignment systems; and, imaging a second alignment mark in the second block space using the second stepper and the data, whereby the patterns imaged by the second stepper on the wafer are aligned with patterns imaged on the wafer by the first stepper.

Accordingly, it is a primary object of the present invention to provide a method of imaging patterns on semiconductor wafers using at least two imaging steppers having differing alignment systems.

Another object of the invention to provide a method as described above which achieves high registration accuracy between the imaged patterns in multiple layers of an integrated circuit.

Another object of the invention is to provide a method of the type mentioned above which achieves alignment accuracy using differing steppers, without the need for supplemental alignment apparatus or additional processing steps to provide clear-out windows in the integrated circuit.

These, and further objects and advantages of the present invention will be made clear or will become apparent during the following description of a preferred embodiment of the invention.

BRIEF DESCRIPTION OF THE DRAWINGS

In the drawings, which form an integral part of the specification, and are to be read in conjunction therewith, and in which like components are used to designate identical components in the various views:

FIG. 1 is an exploded, perspective view of a semiconductor wafer in operative relationship to an alignment reticle positioned thereabove;

FIG. 2 is an enlarged, plan view of a portion of the wafer shown in FIG. 1, depicting alignment marks;

FIG. 3 is an enlarged, plan view of field-by-field alignment marks imaged onto the wafer of FIG. 1;

FIG. 4 is an enlarged, plan view of a global alignment mark imaged onto the wafer of FIG. 1;

DETAILED DESCRIPTION OF THE PREFERRED EMBODIMENT

Figure 5:
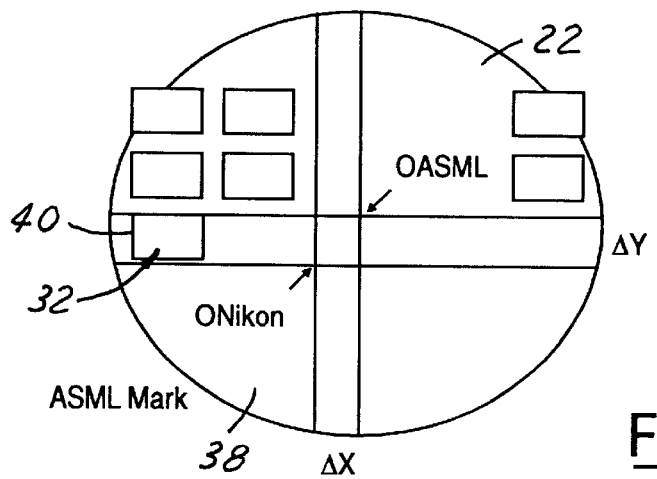
FIG. 5 is a diagrammatic layout showing the positions of alignment marks imaged onto a common wafer, and depicting the spatial offset of the alignment systems of two steppers.

The present invention is directed toward providing a method of manufacturing semiconductor devices, such as ICs (integrated circuits), wherein it becomes necessary to use different steppers having mismatched alignment systems for imaging circuit patterns onto a semiconductor wafer. Two such well know steppers are manufactured respectively by ASML and Nikon which are widely used throughout the semiconductor manufacturing industry. These two steppers possess slightly different machine characteristics, dimensions and alignment systems, which ordinarily prevent their use in processing the same semiconductor wafer. In other words, an ASML stepper cannot be used in forming several preliminary pattern layers on a wafer, where a Nikon stepper is employed in subsequently forming upper layers since the alignment systems of these two steppers are different and would result in an overlay match quality that would be entirely unacceptable. In accordance with the present invention, however, ICs may be manufactured using two stepper having different alignment systems without sacrificing the accuracy of overlay alignment.

Referring first to FIGS. 1–4, a semiconductor wafer 10 possesses a plurality of scribe lines 13 forming a grid pattern that defines individual fields 14 laid out on X and Y orthogonal axes 16, 18 respectively. In order to provide a frame of reference so that the wafer 10 can be properly aligned in processing apparatus, such as step and repeat machines (not shown), a number of alignment marks may be scribed therein, such as the global alignment marks 32 lying along one of the scribe lines corresponding to the X axis 16, and one or more field-by-field alignment marks 34. A central "zero" mark 22 may be applied at the center of the wafer, at the intersection of axes 16, 18. The alignment marks 22, 32, 34 are initially employed to allow proper positioning of the wafer relative to an imaging stepper, and particularly an alignment reticle 24 which forms part of the stepper and is disposed in an optical projection path above the wafer 10. The alignment reticle 24 is used to view the alignment marks 22, 32, 34 scribed on the wafer 10, thereby permitting the wafer 10 to be properly aligned beneath the stepper, in readiness for further processing. As shown in FIG. 1, the reticle 24 will include a centrally located, alignment pattern 33 which is a mirror image of the global alignment mark 32, and a field-by-field alignment mark 34. Further, a pair of rectangular block patterns 26 are disposed along the X axis 16, on opposite sides of the central pattern 33. The block patterns 26, as will be discussed below, are employed to image a pair of rectangular shaped, reserved pattern-free blocks of space onto layers formed on the wafer 10. Finally, other indicia such as further alignment marks patterns 30 or a bar code 28 may be incorporated into the reticle 24 as required.

The wafer 10 typically will include an oriental flat 20. The global alignment mark 32 may include four sets of precisely spaced, aligned parallel lines 32, arranged in a rectangular pattern, as best seen in FIG. 4. The zero mark 22 consists of orthogonal lines symmetrically positioned in the center of the line pattern 32. The field-by-field marks 34 are positioned at any of numerous places, along the scribe lines 13 forming the grid 12, and typically consist of two sets of orthogonal lines 34 disposed on either side of one of the scribe lines.

Referring now to FIG. 5, the optical alignment systems of two steppers possess substantially different geometries in terms of the position of the alignment marks and the zero marks discussed above. For example, with respect to a wafer 10, it can be seen that the zero mark 22 for ASML stepper is diagonally offset from the zero mark 38 of a Nikon stepper, the difference in position of these two marks being represented by $\Delta X_0$ and $\Delta Y_0$.

Figure 6:
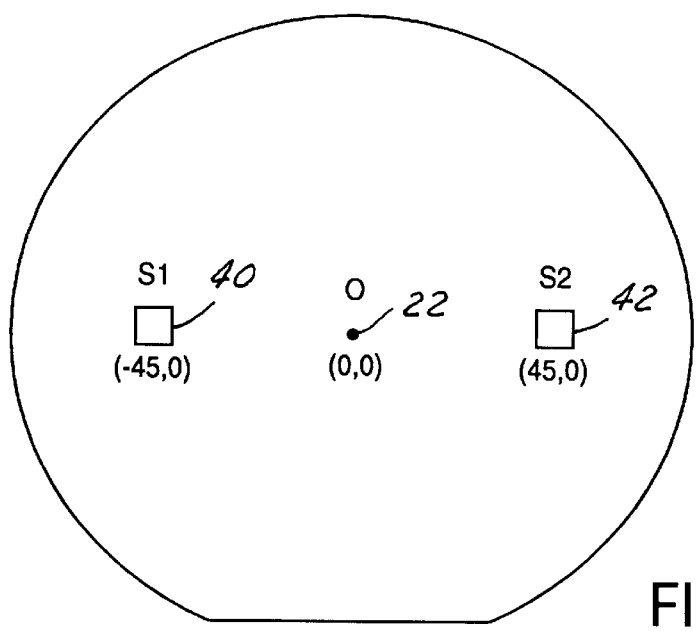
FIG. 6 is a plan view of the wafer shown in FIG. 1, and depicting two blocks of space reserved for the imaging of alignment marks therein in accordance with the preferred embodiment of the present invention.
Figure 7:
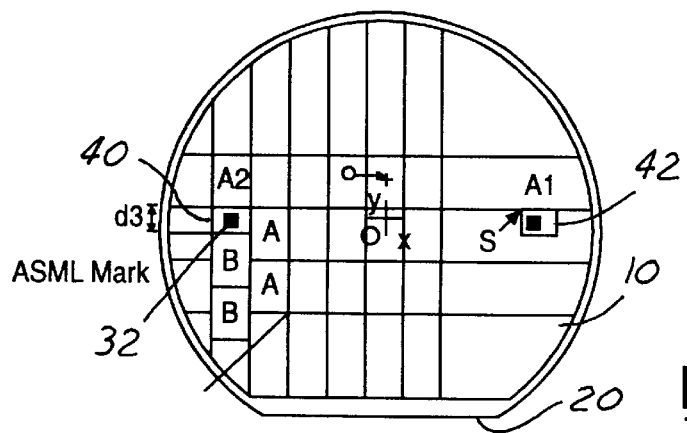
FIG. 7 is a view similar to FIG. 6 but depicting cells formed by scribe lines on the wafer as well as the position of two alignment marks imaged in the reserved blocks of space; and, FIG. 8 is a flow diagram depicting certain steps employed to complete the process of forming a color filter on a partially processed wafer.

Referring also now to FIGS. 6 and 7, in accordance with the present invention, a pair of laterally spaced rectangular block 22 of pattern free space are reserved on the wafer 10, within which alignment-marks 32 of the two different steppers are to be formed. In FIG. 5, it can be seen that the alignment mark 32 produced by the ASML stepper is approximately in the center of the reserved block space 40. However, the block space 40 will have dimensions sufficiently large such that the alignment mark 32 produced by a Nikon stepper will also fall within the reserved block space, even though it is not aligned with the ASML alignment mark.

The two dimensional spatial differences in the features of the two differing alignment systems result from several factors. The first factor is the simple offset from the central, zero marks of the two steppers. Other factors include differences in inter-field translation, and intra-field translation as well as the magnitude of rotation and magnification inherent in the stepper. In accordance with the present invention, a set of data is produced related to the various spatial offsets between the two alignment systems, which in effect, provides a translation of the various coordinates of the second alignment system so as to be compatible with and match those of the first system. This data, and the calculation thereof, is determined in accordance with the following set of formulas:

$$\Delta X_{wafer} = \Delta X_o + \Delta X_{inter} + \Delta X_{intra}$$

$$\Delta Y_{wafer} = \Delta Y_o + \Delta X_{inter} + \Delta X_{intra}$$

where:

$\Delta X_{wafer}$: final overlay error in the X direction, $\Delta Y_{wafer}$: final overlay error in the Y direction, $\Delta X_O$: X direction error due to different coordinate system $\Delta Y_O$: Y direction error due to different coordinate system.

$$\Delta X_{intra} = \Delta X_{M, nikon, intra} + \Delta X_{mark, nikon, intra} + \Delta X_{asml, intra},$$

including intra field translation, rotation and magnification.

$$\Delta Y_{intra} = \Delta Y_{m, nikon, intra} + \Delta Y_{mark, nikon, intra} + \Delta Y_{asml, intra},$$

including intrafield translation, rotation and magnification.

$$\Delta X_{intra} = \Delta X_{m, nikon, intra} + \Delta X_{mark, nikon, intra} + \Delta X_{asml, intra},$$

including intra field translation, rotation and magnification.

$$\Delta Y_{intra} = \Delta Y_{m, nikon, intra} + \Delta Y_{mark, nikon, intra} + \Delta Y_{asml, intra},$$

including intra field translation, rotation and magnification.

and where:

$\Delta X_{M, nikron}$: X direction overlay error in top metal layer processing in Nikon steppers, including interfield and intrafield.

$\Delta Y_{m, nikron}$: Y direction overlay error in top metal layer with Nikon steppers, including interfield and intrafield.

$\Delta X_{mark, nikron}$: X direction overlay error when defined "zero mark" with Nikon steppers including interfield and intrafield.

$\Delta Y_{mark, nikron}$: Y direction overlay error when defined "zero mark" with Nikon stepper including interfield and intrafield.

In practical use, the above translation formulas can be used to employ both an ASML stepper and a Nikon stepper in multiple steps of producing the same IC. For example, job files for producing the IC include data that reserves the block spaces 40, 42 before processing begins. Then, using an ASML stepper, an ASML alignment reticle 24 is used to properly position the wafer l0 beneath the ASML stepper. At this point, the wafer 10 has been "aligned" in the ASML alignment system. One or more layers of pattern material may be then formed on the surface of the wafer 10, including a transparent dielectric. At this point, the wafer may be realigned into a Nikon stepper using a Nikon reticle which positions the wafer 10 beneath the Nikon stepper, using the previous alignment marks formed on the wafer 10. This Nikon alignment reticle effectively provides a translation of the Nikon and ASML alignment systems so that the wafer 10 is aligned in the Nikon alignment system using the ASML alignment marks. With the wafer properly positioned beneath the Nikon stepper, subsequent layers may be formed, including an opaque metal layer, at which point a new set of alignment marks 32 from the Nikon alignment system are imaged onto the top metal layer, within the reserved block space 40, 42. Using this translation methodology to correlate the two different alignment systems, overlay registration between multiple layers can be achieved within 0.3 $\mu$m.

Figure 8:
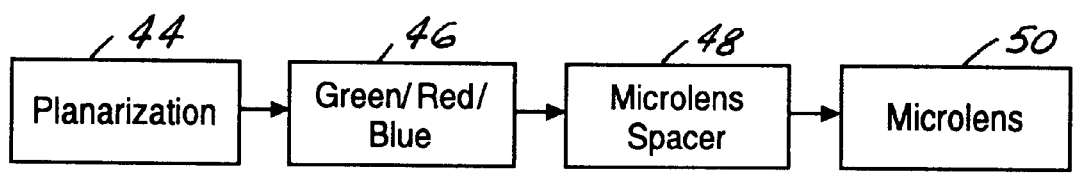
Figure 9:
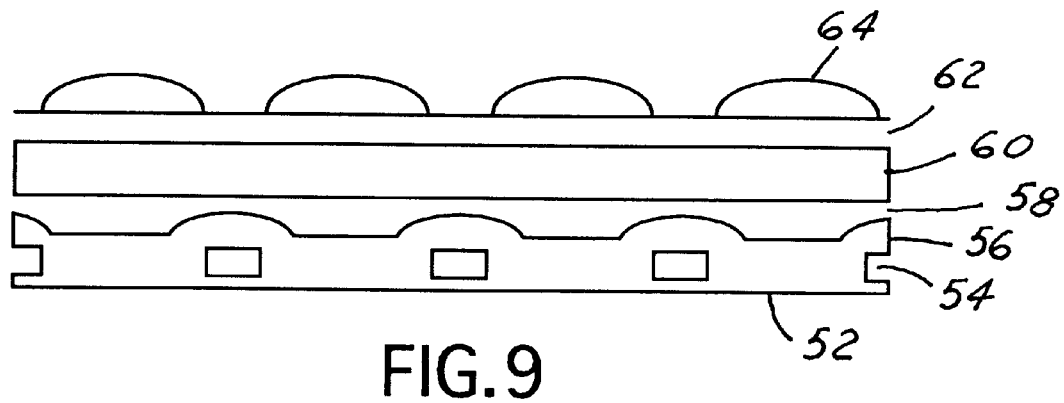
FIG. 9 is an enlarged, cross-sectional view of the color filter of FIG. 8.

The above described method is useful, for example, in the production of ICs used to produce color displays. Referring now to FIGS. 8 and 9, a photodiode 52 is first formed on the surface of a wafer, which comprises a series of metal conductors 54 covered with a layer of passivation 56 that forms an irregular upper surface. This irregular upper surface is planarized by depositing a layer of material 58 over the passivation layer. After the planarization step 44 has been performed, a subsequent step 46 is performed to form a color filter layer 60, providing green, red and blue elements. Then a micro lens spacer 62 is applied at step 48 following which a micro lens 64 is applied at step 50.

From the foregoing, it is apparent that the novel method described above not only provides for the reliable accomplishment of the objects of the objects of the invention, but it does so in a particularly economical and efficient manner. It is recognized, of course, that those skilled in the art may make various modifications or additions to the preferred embodiment chosen to illustrate the invention without departing from the spirit and scope of the present contribution to the art. Accordingly, it is to be understood that the protection sought and to be afforded hereby should be deemed to extend to the subject matter claimed and all equivalents thereof fairly within the scope of the invention.

What is claimed is:

1. A method of forming circuit patterns on a semiconductor wafer using first and second optical imaging steppers respectively having first and second differing optical alignment systems, comprising the steps of:
   (a) imaging a first alignment mark on said wafer using said first stepper;
   (b) determining the two dimensional optical coordinate differences between said first and second alignment systems;
   (c) translating the optical coordinates of second alignment system based on the coordinate differences determined in step (b), whereby to correlate said second alignment system with said first alignment system; and
   (d) imaging a second alignment mark on said wafer using said second alignment system and the optical coordinates translated in step (c), whereby said first and second alignment marks are aligned in a common optical alignment system.

2. The method of claim 1, including the step of:
   reserving first and second blocks of pattern-free space on said wafer, and wherein step (a) is performed by imaging said first alignment mark in said first block of space; and
   step (d) is performed by imaging said second alignment mark in said second block of space.

3. The method of claim 1, including the step of producing an overlay reference pattern exhibiting a set of desired alignment properties related to the alignment of said first and second alignment systems, and comparing the circuit patterns on said wafer to said reference pattern to thereby verify that said desired alignment between said first and second steppers has been achieved.

4. The method of claim 1, including the step of applying a layer of passivation on said wafer, and wherein step (a) is performed by imaging said first alignment mark on said passivation layer.

5. The method of claim 1, including the step of applying a layer of metal on said wafer above said passivation layer, and wherein step (a) is performed by imaging said second mark on said metal layer.

6. A method of imaging alignment marks onto a semiconductor wafer using first and second optical imaging steppers respectively having first and second, spatially non-aligned optical imaging systems, comprising the steps of:
   (a) imaging a first alignment mark on said wafer using said first stepper;
   (b) producing a set of data representing the two dimension optical offset between said first and second optical imaging systems; and
   (c) imaging a second alignment mark on said wafer using said second stepper and the data set produced in step (b), such that said second alignment mark is aligned with said first alignment mark in said first optical imaging system.

7. A method of forming circuit patterns on a semiconductor wafer using first and second optical imaging steppers respectively having first and second differing optical alignment systems, each of said alignment systems including at least one alignment mark for aligning images on said wafer, comprising the steps of:
   (a) reserving first and second, spaced apart, pattern-free blocks of space on said wafer within which alignment marks may be imaged;
   (b) imaging a first alignment mark in said first block space using said first stepper;
   (c) producing a set of data representing the two dimensional spatial offset between said first and second optical alignment systems; and
   (d) imaging a second alignment mark in said second block space using said second stepper and the data produced in step (c), whereby the patterns imaged by said second stepper on said wafer are aligned with the patterns imaged on said wafer by said first stepper.

\* \* \* \* \*